US011035745B2

(12) United States Patent
Tanaka et al.

(10) Patent No.: US 11,035,745 B2
(45) Date of Patent: Jun. 15, 2021

(54) TORQUE SENSOR

(71) Applicants: SOKEN, INC., Nisshin (JP); DENSO CORPORATION, Kariya (JP)

(72) Inventors: Ken Tanaka, Nisshin (JP); Shingo Shimizu, Nisshin (JP); Shigetoshi Fukaya, Kariya (JP); Satoru Jinno, Kariya (JP); Toshiro Suzuki, Kariya (JP)

(73) Assignees: SOKEN, INC., Nisshin (JP); DENSO CORPORATION, Kariya (JP)

( * ) Notice: Subject to any disclaimer, the term of this patent is extended or adjusted under 35 U.S.C. 154(b) by 129 days.

(21) Appl. No.: 16/550,913

(22) Filed: Aug. 26, 2019

(65) Prior Publication Data

US 2019/0383679 A1 Dec. 19, 2019

Related U.S. Application Data

(63) Continuation of application No. PCT/JP2018/010147, filed on Mar. 15, 2018.

(30) Foreign Application Priority Data

Mar. 31, 2017 (JP) .............................. JP2017-069924

(51) Int. Cl.
| | |
|---|---|
| *G01L 3/10* | (2006.01) |
| *G01R 33/00* | (2006.01) |
| *G01R 33/02* | (2006.01) |
| *B62D 6/10* | (2006.01) |
| *G01L 5/22* | (2006.01) |

(52) U.S. Cl.
CPC .......... *G01L 3/101* (2013.01); *G01R 33/0029* (2013.01); *G01R 33/02* (2013.01); *B62D 6/10* (2013.01); *G01L 5/221* (2013.01)

(58) Field of Classification Search
CPC ......... G01L 3/104; G01L 3/101; G01L 5/221; G01R 33/0029; G01R 33/02; B62D 6/10
USPC ......................... 73/862.08, 862.331–862.338
See application file for complete search history.

(56) References Cited

U.S. PATENT DOCUMENTS

| | | | |
|---|---|---|---|
| 8,800,388 B2* | 8/2014 | Takahashi | ............... G01L 3/101 73/862.331 |
| 9,302,700 B2* | 4/2016 | Yoshida | ................. G01L 3/101 |
| 2002/0189371 A1 | 12/2002 | Nakane et al. | |

(Continued)

FOREIGN PATENT DOCUMENTS

JP          2006-71326 A          3/2006

*Primary Examiner* — Octavia Hollington
(74) *Attorney, Agent, or Firm* — Posz Law Group, PLC

(57) ABSTRACT

A torque sensor includes: a torsion bar coaxially connecting a first shaft and a second shaft; a multipole magnet; a pair of magnetic yokes; and a magnetic sensor capable of detecting a density of magnetic flux formed by the pair of the magnetic yokes and having an inner magnetosensitive surface facing inward in a radial direction and an outer magnetosensitive surface facing outward in the radial direction when viewed along a central axis of the torsion bar. The torque sensor includes: a magnetic flux guiding member capable of magnetically coupling the magnetic yoke and the outer magnetosensitive surface of the magnetic sensor; and a water blocking portion capable of housing the magnetic sensor and the magnetic flux guiding member to restrict the magnetic sensor from coming into contact with water.

7 Claims, 10 Drawing Sheets

(56) References Cited

U.S. PATENT DOCUMENTS

| | | |
|---|---|---|
| 2003/0209087 A1 | 11/2003 | Nakane et al. |
| 2006/0137474 A1 | 6/2006 | Nakane et al. |
| 2008/0258715 A1 | 10/2008 | Reichert |
| 2016/0153850 A1 | 6/2016 | Takahashi et al. |
| 2020/0158795 A1* | 5/2020 | Suzuki ................ H02K 1/2753 |

* cited by examiner

TORQUE SENSOR

CROSS REFERENCE TO RELATED APPLICATION

The present application is a continuation application of International Patent Application No. PCT/JP2018/010147 filed on Mar. 15, 2018, which designated the U.S. and claims the benefit of priority from Japanese Patent Application No. 2017-069924 filed on Mar. 31, 2017. The entire disclosures of all of the above applications are incorporated herein by reference.

TECHNICAL FIELD

The present disclosure relates to a torque sensor.

BACKGROUND

A torque sensor includes a set of magnetic yokes forming a magnetic circuit with a multipole magnet provided on a rotating shaft, and a magnetic sensor provided between the set of magnetic yokes to detect the magnetic flux density of the magnetic circuit.

SUMMARY

According to an aspect of the present disclosure, a torque sensor includes: a torsion bar coaxially connecting a first shaft and a second shaft; a multipole magnet having N poles and S poles alternately provided in a circumferential direction to generate magnetic flux in a radial direction; a pair of magnetic yokes to form a magnetic circuit in a magnetic field formed by the multipole magnet; a magnetic sensor capable of detecting a density of the magnetic flux formed by the pair of the magnetic yokes, the magnetic sensor having an inner magnetosensitive surface facing inward in the radial direction and an outer magnetosensitive surface facing outward in the radial direction when viewed along a central axis of the torsion bar; a magnetic flux guiding member capable of magnetically coupling the magnetic yoke and the outer magnetosensitive surface of the magnetic sensor; and a water blocking portion capable of housing the magnetic sensor and the magnetic flux guiding member to restrict the magnetic sensor from coming into contact with water.

DESCRIPTION OF EMBODIMENTS

Figure 1:
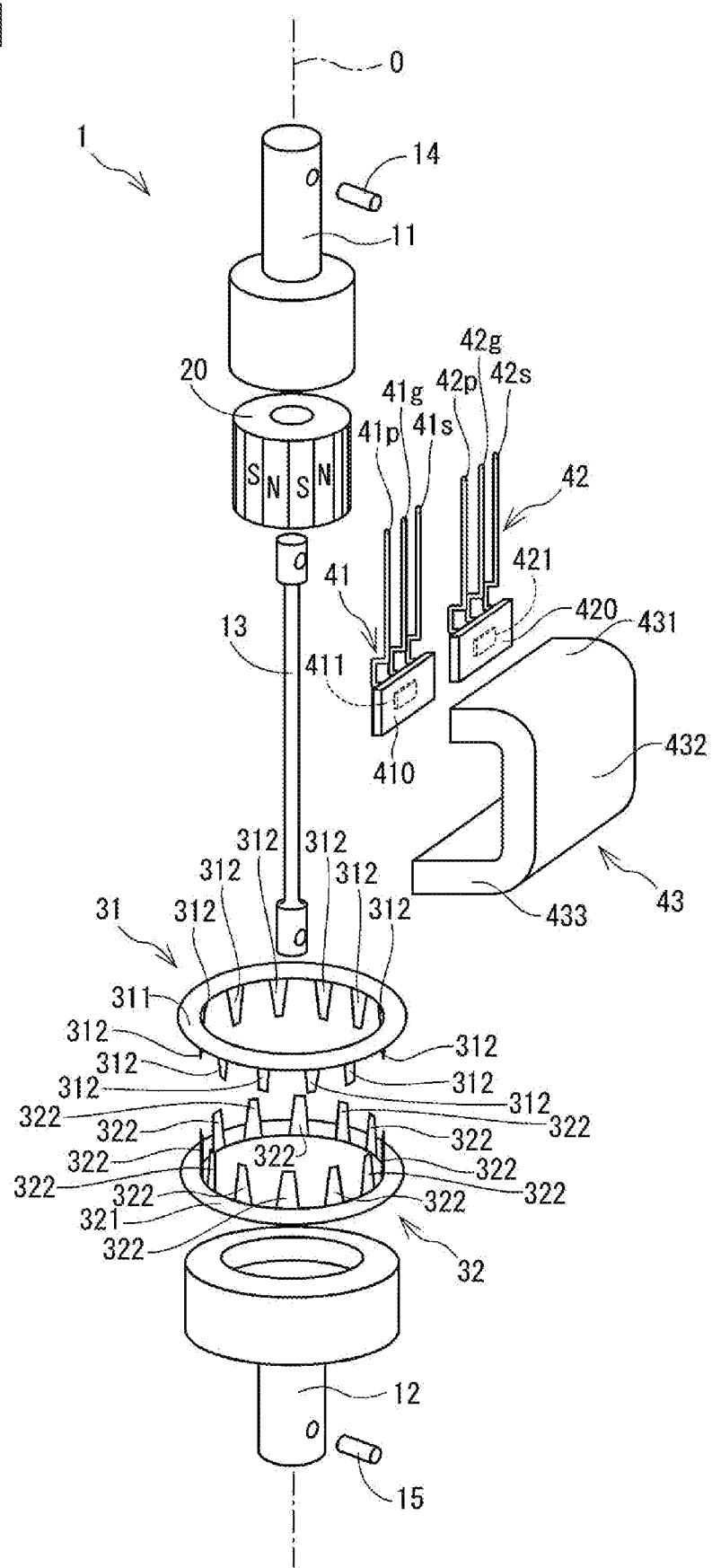
FIG. 1 is an exploded perspective view of a torque sensor according to a first embodiment.

To begin with, examples of relevant techniques will be described.

A torque sensor detects an axial torque acting on a rotational shaft based on a change in magnetic flux density of a magnetic circuit. For example, a torque sensor includes a set of magnetic yokes, a set of magnetic collection rings, and a magnetic sensor provided between the set of magnetic collection rings. The set of magnetic yokes have plural claws formed to extend in the radial direction with respect to a multipole magnet that is magnetized to generate magnetic flux in the axial direction. The set of magnetic collection rings are provided radially outward of the magnetic yoke and magnetically coupled to the magnetic yoke.

When the torque sensor is applied to, for example, an electric power steering device of a vehicle, the torque sensor needs to reliably operate even in a situation where water may be splashed, and needs to be downsized to enlarge the engine room of the vehicle. The magnetic sensor and an electric circuit for the magnetic sensor are sealed for the waterproofness, such that there is no path through which water can infiltrate. However, in the case where a magnetic sensor is provided between a pair of magnetic collection rings, water may flow through an interface between the magnetic collection ring and the sealing material while the magnetic sensor is sealed. For this reason, not only the structure for the sealing is complicated but also the size is increased in the torque sensor, when the magnetic sensor and the magnetic collection ring are integrally and annularly sealed.

Further, in the torque sensor, the magnetic sensor is formed such that the magnetic sensitive surface is along the axial direction, and the wiring of the magnetic sensor is formed to project radially outward from the magnetic sensor. Thus, the size of the torque sensor is relatively large in the radial direction. If there is nothing blocking the leakage flux between the magnetic sensor and the surface of the multipole magnet, the leakage flux from the multipole magnet affects the detection sensitivity of the magnetic sensor. In this case, a protrusion is provided to protrude from the magnetic collection ring in the radial direction to support the magnetic sensor. For this reason, the size of the torque sensor is further increased in the radial direction.

The present disclosure provides a torque sensor in which the waterproofness is improved while the size is reduced.

The present disclosure provides a torque sensor including a torsion bar, a multipole magnet, a pair of magnetic yokes, a magnetic sensor, a magnetic flux guiding member, and a water blocking portion. The torsion bar coaxially connects the first shaft and the second shaft, and converts torque applied between the first shaft and the second shaft into torsional displacement. The multipole magnet is fixed to the first shaft or one end of the torsion bar, and N poles and S poles are alternately provided in the circumferential direction to generate magnetic flux in the radial direction. The pair of magnetic yokes is fixed to the second shaft or the other end of the torsion bar to form a magnetic circuit in the magnetic field formed by the multipole magnet. The magnetic sensor is provided radially outward of the pair of magnetic yokes. The magnetic sensor has an inner magnetosensitive surface formed to be directed radially inward when viewed along the central axis of the torsion bar, and an outer magnetosensitive surface formed to be directed radially outward when viewed along the central axis of the torsion bar. The magnetic sensor can detect the magnetic flux density of the magnetic circuit formed in the pair of magnetic yokes. The magnetic flux guiding member is made of a soft magnetic material, is located radially outward of the outer magnetosensitive surface, and can magnetically couple the magnetic yoke to the outer magnetosensitive surface of the magnetic sensor. The water blocking portion is formed to house the magnetic sensor and the magnetic flux guiding member, and restricts the magnetic sensor from contacting with water.

In the torque sensor of the present disclosure, the magnetic sensor is formed such that the two magnetosensitive surfaces extend in the radial direction. The magnetic sensor is provided such that, of the two magnetosensitive surfaces the inner magnetosensitive surface is directed radially inward in cross-section passing the center axis of the torsion bar. When the inner magnetosensitive surface faces the magnetic yoke, the magnetic sensor is easy to magnetically couple with the magnetic circuit of one of the magnetic yokes. When the inner magnetosensitive surface is formed to be directed radially inward as viewed along the central axis of the torsion bar, the inner magnetosensitive surface faces the torsion bar. The outer magnetosensitive surface formed to be directed radially outward magnetically couples the magnetic sensor with the other magnetic yoke of the pair of magnetic yokes via the magnetic flux guiding member. When the outer magnetosensitive surface is oriented radially outward as viewed along the central axis of the torsion bar, the outer magnetosensitive surface is oriented opposite to and away from the torsion bar. Thus, the magnetic sensor of the torque sensor according to the present disclosure can reliably detect the magnetic flux density of the magnetic circuit of the pair of magnetic yokes, and can have the wiring extended in a direction other than the radially outward direction of the magnetic yoke. Therefore, the torque sensor of the present disclosure can reduce the size in the radial direction as compared to a torque sensor formed so that the wiring projects outward from the magnetic sensor in the radial direction.

Further, in the torque sensor of the present disclosure, the magnetic sensor and the magnetic flux guiding member, which are provided radially outward of the pair of magnetic yokes, are housed in the water blocking portion.

Thereby, the shape of the water blocking portion is simplified as compared with a case where, for example, the torque sensor includes a magnetic collection ring and the magnetic sensor, which are integrally and annularly sealed. Since there is no path through which water can penetrate from outside, such as interface between components, the magnetic sensor can be reliably prevented from water.

As described above, the torque sensor of the present disclosure includes the magnetic sensor having the inner magnetosensitive surface and the magnetic flux guiding member capable of magnetically coupling the outer magnetosensitive surface of the magnetic sensor and the magnetic yoke. Accordingly, the magnetic flux density is reliably detected, at the same time, the size can be reduced in the radial direction. Further, the magnetic sensor can be reliably protected from water by the simple configuration of the water blocking portion, to improve the waterproofness.

Hereinafter, embodiments of the present disclosure will be described based on the drawings. In the embodiments, the same reference marks are used for substantially the same element, and description thereof will be omitted.

First Embodiment

Figure 2:
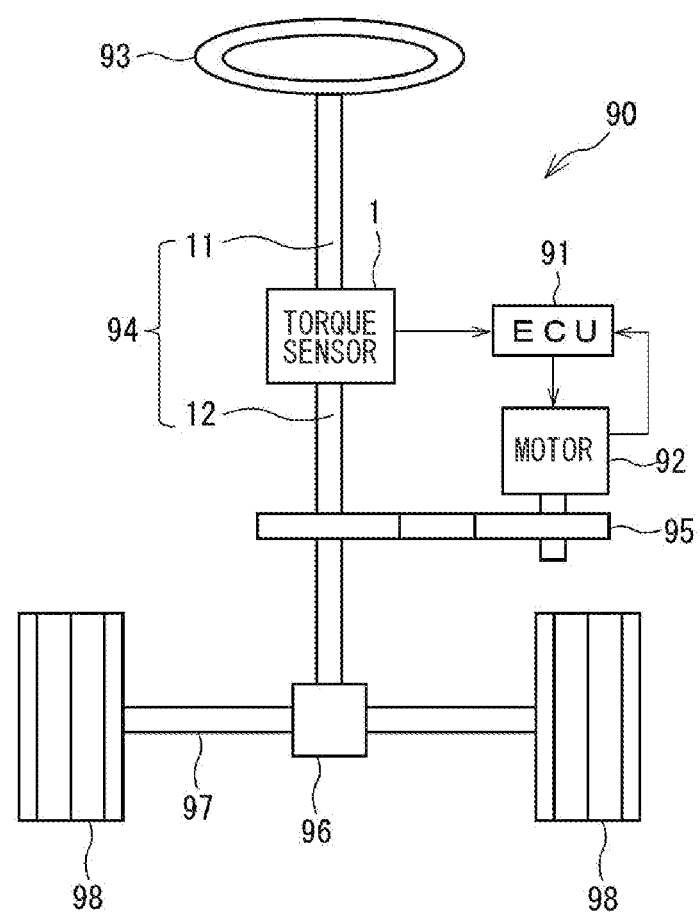
FIG. 2 is a schematic configuration diagram of an electric power steering apparatus to which the torque sensor according to the first embodiment is applied.

As shown in FIG. 2, a torque sensor 1 according to a first embodiment is applied to, for example, an electric power steering apparatus 90 for assisting a steering operation of a vehicle. FIG. 2 shows an entire configuration of a steering system including the electric power steering apparatus 90.

The torque sensor 1 is provided on a steering shaft 94 connected to a steering wheel 93. A pinion gear 96 is provided at an axial end of the steering shaft 94. The pinion gear 96 meshes with a rack shaft 97. A pair of road wheels 98 is rotatably coupled to ends of the rack shaft 97 via a tie rod or the like. The rotational movement of the steering shaft 94 is converted into linear movement of the rack shaft 97 by the pinion gear 96, and the pair of road wheels 98 is steered.

The torque sensor 1 is provided between an input shaft 11 as a "first shaft" and an output shaft 12 as a "second shaft." The input shaft 11 and the output shaft 12 define the steering shaft 94. The torque sensor 1 detects a steering torque applied to the steering shaft 94 and outputs the detected steering torque to an ECU 91. The ECU 91 controls the output of a motor 92 in accordance with the detected steering torque. The steering assist torque generated by the motor 92 is transmitted to the steering shaft 94 after speed reduction by the reduction gear 95.

Next, configuration of the torque sensor 1 will be described with reference to FIG. 1, FIG. 3 and FIG. 4.

The torque sensor 1 includes a torsion bar 13, a multipole magnet 20, a pair of magnetic yokes 31 and 32, two magnetic sensors 41 and 42, a magnetic flux guiding member 43, and a connector portion 45 corresponding to a "water blocking portion".

The torsion bar 13 is a rod-like resilient member, and is provided between the input shaft 11 and the output shaft 12. One end of the torsion bar 13 is fixed to the input shaft 11 by a fixing pin 14. The other end of the torsion bar 13 is fixed to the output shaft 12 by a fixing pin 15. Thereby, the torsion bar 13 connects the input shaft 11 and the output shaft 12 along the rotation axis O as the "central axis". The torsion bar 13 converts a steering torque applied to the steering shaft 94 into a torsional displacement.

The multipole magnet 20 is a cylindrical member and is fixed to the input shaft 11. In the multipole magnet 20, N poles and S poles are alternately provided in the circumferential direction to generate magnetic flux in the radial direction. In the first embodiment, the multipole magnet 20 has, for example, 12 pairs of N poles and S poles, that is, 24 poles in total.

The magnetic yoke 31, 32 is an annular body made of a soft magnetic material. The pair of magnetic yokes 31 and 32 is fixed to the output shaft 12 so as to be located radially outward of the multipole magnet 20. The pair of magnetic yokes 31 and 32 form a magnetic circuit in the magnetic field formed by the multipole magnet 20.

The magnetic yoke 31 has an annular portion 311 and plural claws 312. The annular portion 311 has a ring shape, and is provided radially outward of the end portion of the multipole magnet 20 adjacent to the input shaft 11. The claws 312 are formed to extend from the radially inner edge of the annular portion 311 along the rotation axis O toward the output shaft 12. In the first embodiment, twelve claws 312 are provided at equal intervals around the entire circumference of the annular portion 311.

The magnetic yoke 32 has an annular portion 321 and plural claws 322. The annular portion 321 has a ring shape, and is provided radially outward of the end portion of the multipole magnet 20 adjacent to the output shaft 12. The claws 322 are formed to extend from the radially inner edge of the annular portion 321 along the rotation axis O toward the input shaft 11. In the first embodiment, twelve claws 322 are provided at equal intervals all around the annular portion 321.

The claws 312 and the claws 322 are alternately arranged in the circumferential direction. That is, as shown in FIG. 4, the magnetic yoke 31 and the magnetic yoke 32 face each other in the direction along the rotation axis O (hereinafter, referred to as "rotation axial direction") via an air gap. In the first embodiment, the pair of magnetic yokes 31 and 32 are resin-sealed to be integrated by the resin portion 33 and fixed to the output shaft 12 so as to face each other in the rotation axial direction via the air gap.

Figure 3:
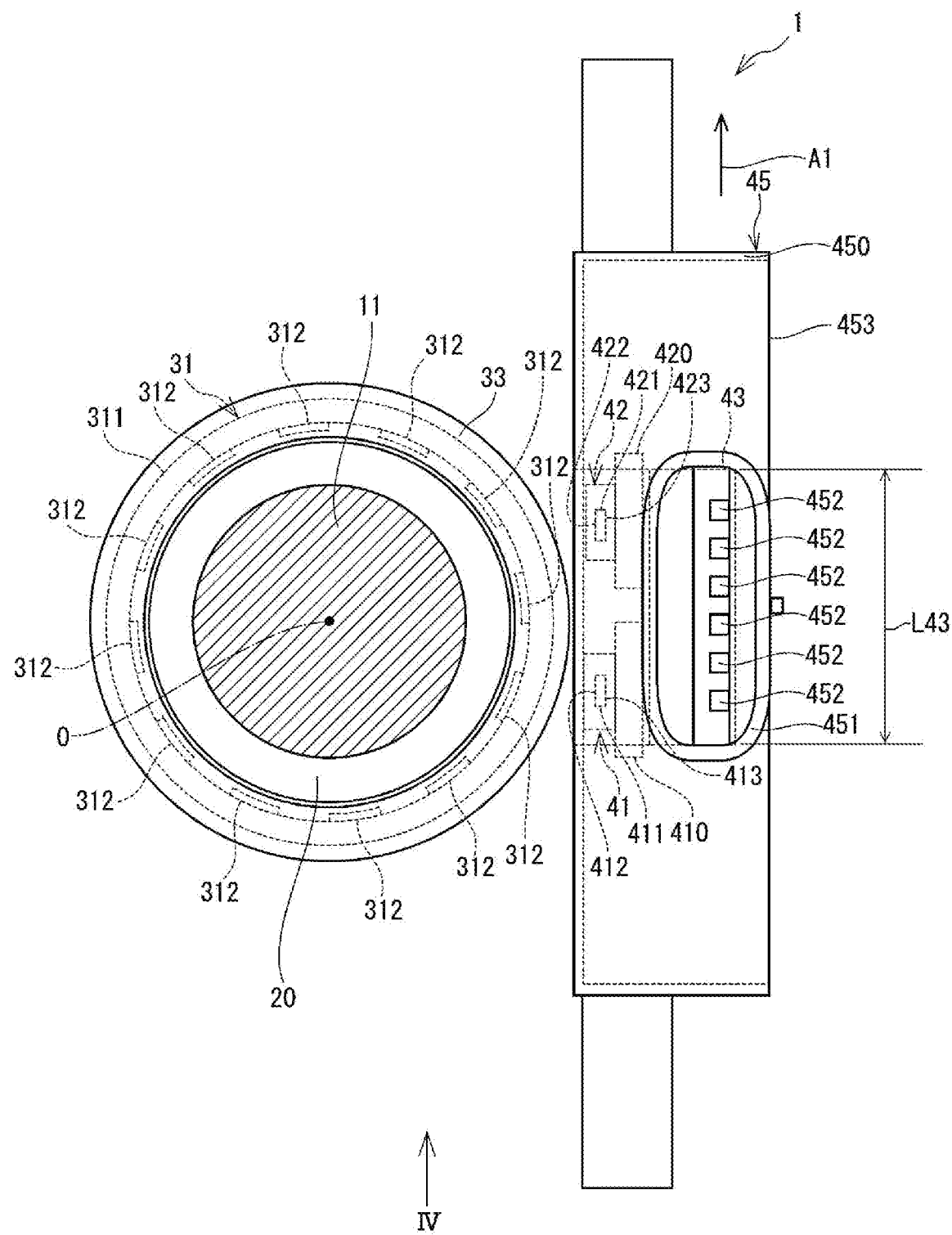
FIG. 3 is a top view of the torque sensor according to the first embodiment.
Figure 4:
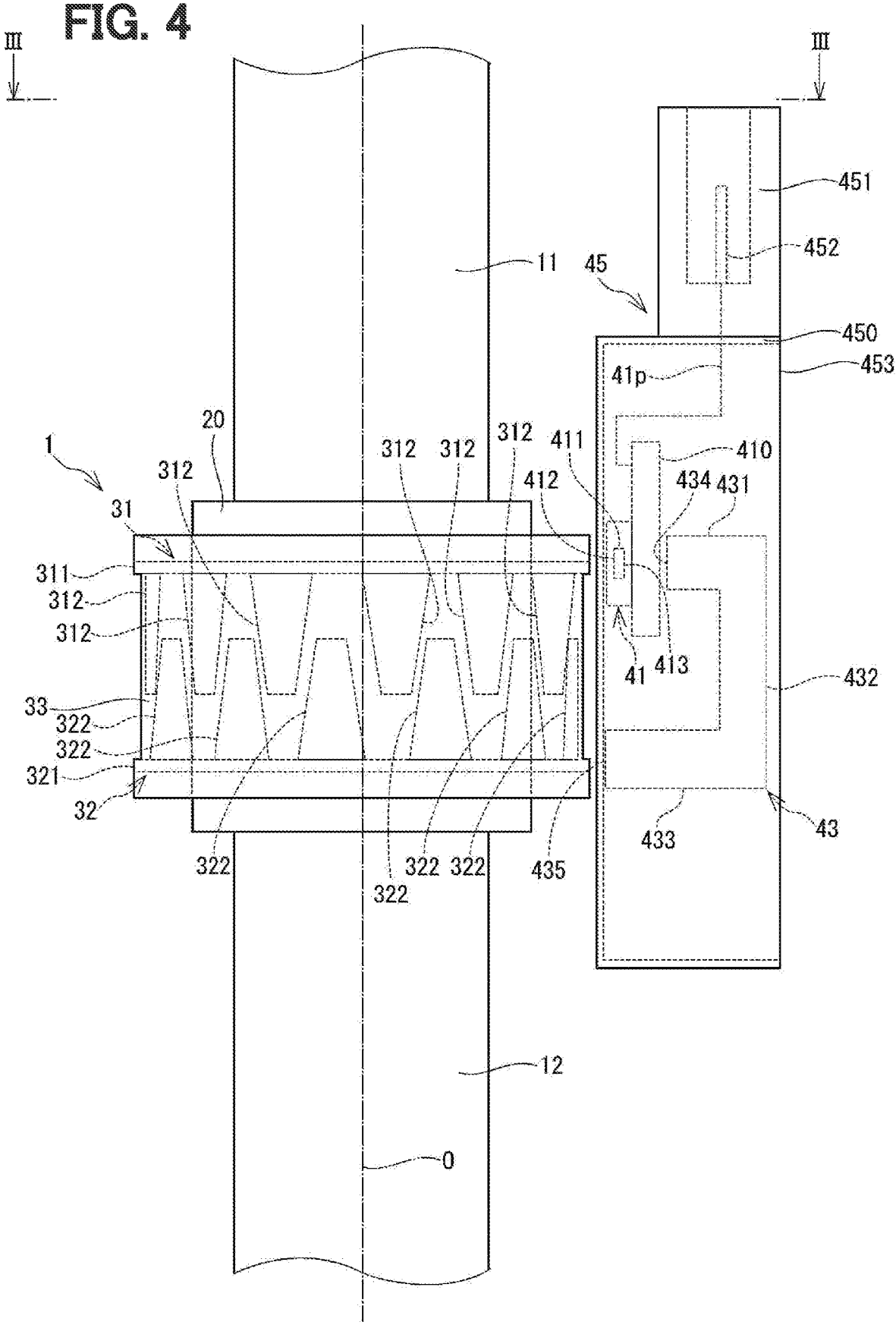
FIG. 4 is a side view of the torque sensor according to the first embodiment.

As shown in FIGS. 3 and 4, the magnetic sensors 41 and 42 are provided radially outward of the magnetic yoke 31. In the first embodiment, the magnetic sensors 41 and 42 are provided in the vicinity of the magnetic yoke 31 and arranged in the direction perpendicular to the rotation axial direction. As shown in FIGS. 3 and 4, the two magnetic sensors 41 and 42 are housed in the connector portion 45, and are respectively mounted on the circuit boards 410 and 420. In the first embodiment, the two magnetic sensors 41, 42 are used.

Even if one of the magnetic sensors fails to function, it is possible to detect the magnetic flux density of the magnetic circuit formed in the pair of magnetic yokes 31, 32 by the other magnetic sensor. The probability that the two magnetic sensors 41 and 42 fail simultaneously is considered to be extremely low.

The magnetic sensor 41 is an IC package formed in a rectangular parallelepiped shape whose height is smaller than the width and depth, and includes a Hall element 411, a power supply line 41p, a ground line 41g, and a signal line 41s.

The Hall element 411 has two magnetosensitive surfaces 412 and 413 formed substantially in parallel. The two magnetosensitive surfaces 412 and 413 are formed to be substantially parallel to the direction perpendicular to the rotation axis O. The magnetosensitive surface 412 corresponds to an inner magnetosensitive surface formed to be directed inward of the magnetic yoke 31 in the radial direction as viewed along the central axis of the torsion bar. Specifically, the magnetosensitive surface 412 is formed to face the radially outer end surface of the annular portion 311 of the magnetic yoke 31. The magnetosensitive surface 413 corresponds to an outer magnetosensitive surface formed to be directed outward of the magnetic yoke 31 in the radial direction as viewed along the central axis of the torsion bar. The Hall element 411 detects the magnetic flux density passing through the magnetosensitive surface 412, 413 as the strength of the magnetic field, and outputs an output signal corresponding to the detected strength of the magnetic field.

As shown in FIGS. 1 and 4, the power supply line 41p, the ground line 41g, and the signal line 41s are electrically connected to the Hall element 411 through the circuit board 410 on which the magnetic sensors 41 and 42 are mounted. The power supply line 41p receives power supplied from the outside. The ground line 41g is electrically connected to the ground. The signal line 41s outputs an output signal according to the magnetic flux density of the magnetic circuit detected by the Hall element 411 to the outside. The power supply line 41p, the ground line 41g, and the signal line 41s are formed to extend in the rotation axial direction as shown in FIG. 1. The power supply line 41p, the ground line 41g, and the signal line 41s are electrically connected to the ECU 91 through the terminal 452 of the connector portion 45.

The magnetic sensor 42 is an IC package formed in a rectangular parallelepiped shape whose height is smaller than the width and the depth, and includes a Hall element 421, a power supply line 42p, a ground line 42g, and a signal line 42s.

The Hall element 421 has two magnetosensitive surfaces 422 and 423 formed substantially in parallel. The two magnetosensitive surfaces 422 and 423 are formed to face in a direction perpendicular to the rotation axis O. The magnetosensitive surface 422 corresponds to an inner magnetosensitive surface formed to be directed inward of the magnetic yoke 31 in the radial direction as viewed along the central axis of the torsion bar. Specifically, the magnetosensitive surface 422 is formed to face the radially outer end surface of the annular portion 311 of the magnetic yoke 31. The magnetosensitive surface 423 corresponds to an outer magnetosensitive surface formed to be directed radially outward of the magnetic yoke 31 as viewed along the central axis of the torsion bar. The Hall element 421 detects the magnetic flux density passing through the magnetosensitive surface 422, 423 as the strength of the magnetic field, and outputs an output signal corresponding to the detected strength of the magnetic field.

As shown in FIGS. 1 and 4, the power supply line 42p, the ground line 42g, and the signal line 42s are electrically connected to the Hall element 421 through the circuit board 420. The power supply line 42p receives power supplied from the outside. The ground line 42g is electrically connected to the ground. The signal line 42s outputs an output signal according to the magnetic flux density of the magnetic circuit detected by the Hall element 421 to the outside. The power supply line 42p, the ground line 42g, and the signal line 42s are formed to extend in the rotation axial direction as shown in FIG. 1. The power supply line 42p, the ground line 42g, and the signal line 42s are electrically connected to the ECU 91 via the terminal 452 of the connector portion 45.

The magnetic flux guiding member 43 is made of a soft magnetic material, and is provided radially outward of the magnetic sensor 41, 42 and radially outward of the magnetic yoke 32 when viewed from the rotation axis O. As shown in FIGS. 3 and 4, the magnetic flux guiding member 43 is housed in the connector portion 45 together with the two magnetic sensors 41 and 42 and the circuit boards 410 and 420.

The magnetic flux guiding member 43 has a first radial portion 431 extending in the radial direction, an axial portion 432 extending in the axial direction, and a second radial portion 433 extending in the radial direction. The first radial portion 431, the axial portion 432, and the second radial portion 433 are integrally formed. The magnetic flux guiding member 43 is magnetically coupled to the magnetic yoke 31, the magnetic sensors 41 and 42, and the magnetic yoke 32 to induce the magnetic flux of the magnetic circuit formed in the magnetic yokes 31 and 32.

The first radial portion 431 is located radially outward of the magnetic sensors 41 and 42 when viewed from the rotation axis O. As shown in FIG. 4, the first radial portion 431 has an end surface 434 facing the magnetosensitive surface 413, 423 of the magnetic sensor 41, 42. The first radial portion 431 is formed to extend from the vicinity of the magnetic sensors 41 and 42 outward in the radial direction of the magnetic yoke 31. The first radial portion 431 can be magnetically coupled to the magnetosensitive surfaces 413 and 423 of the magnetic sensors 41 and 42. As shown in FIG. 3, the first radial portion 431 has a length L43 in a solid arrow direction A1 in which the magnetic sensors 41 and 42 are arranged and perpendicular to the rotation axis O. The length L43 is set to cover the magnetosensitive surfaces 412 and 422 from the radially outer side of the magnetic sensor 41.

The axial portion 432 is formed to extend from the radially outer end of the first radial portion 431 along the output shaft 12. The axial portion 432 is formed to have the same length in the solid arrow direction A1 in which the magnetic sensors 41 and 42 are arranged, as the length L43 of the first radial portion 431.

The second radial portion 433 is formed to extend inward in the radial direction of the magnetic yoke 32 from the end of the axial portion 432 adjacent to the output shaft 12. The second radial portion 433 has the radially inner end surface 435 that faces the radially outer end surface of the annular portion 321 of the magnetic yoke 32. The second radial portion 433 can be magnetically coupled to the magnetic yoke 32.

The connector portion 45 is a substantially rectangular member. The connector portion 45 has a hollow case 450 made of resin, a connector 451, a terminal 452, and a potting material 453.

The case 450 can hold the circuit board 410 on which the magnetic sensors 41 and 42 are mounted and the magnetic flux guiding member 43.

The connector 451 is a bottomed substantially cylindrical portion provided on the outer wall surface of the case 450.

The terminal 452 is housed in the connector 451. The terminal 452 is electrically connected to each of the power supply line 41p, the ground line 41g, the signal line 41s, the power supply line 42p, the ground line 42g, and the signal line 42s of the magnetic sensors 41 and 42.

The potting material 453 is filled inside the case 450.

The connector portion 45 is provided such that the magnetosensitive surfaces 412 and 422 of the magnetic sensors 41 and 42 face the radially outer end surface of the annular portion 311 of the magnetic yoke 31.

When the torque sensor 1 is assembled, the circuit board 410 on which the magnetic sensors 41 and 42 are mounted and the magnetic flux guiding member 43 are disposed inside the case 450. At this time, each of the power supply line 41p, the ground line 41g, the signal line 41s, the power supply line 42p, the ground line 42g, and the signal line 42s is connected to the terminal 452.

Next, the potting material 453 is filled in the case 450 in which the circuit board 410 and the magnetic flux guiding member 43 are disposed. Thereby, the magnetic sensors 41 and 42 can be protected from water.

Next, the operation of the torque sensor 1 will be described.

In a neutral state where no steering torque is applied between the input shaft 11 and the output shaft 12, no torsional displacement occurs in the torsion bar 13. At this time, the boundary between the N pole and the S pole of the multipole magnet 20 is in agreement with the center of the claw 312 or the claw 322. In the neutral state, the magnetic flux does not leak to the gap between the magnetic yoke 31 and the magnetic yoke 32 because the same number of lines of magnetic force enter and exit relative to each of the claws 312 and 322 from the N pole and the S pole of the multipole magnet 20. The magnetic flux density detected by the magnetic sensors 41 and 42 is zero. When a steering torque is applied between the input shaft 11 and the output shaft 12 and a torsional displacement occurs in the torsion bar 13, a relative position between the multipole magnet 20 fixed to the input shaft 11 and the pair of magnetic yokes 31 and 32 fixed to the output shaft 12 changes in the circumferential direction.

For example, when the claw 312 of the magnetic yoke 31 faces the N pole and the claw 322 of the magnetic yoke 32 faces the S pole, the magnetic line having N poles and the magnetic line having S poles are respectively increased in the magnetic yoke 31 and the magnetic yoke 32. As a result, the density of magnetic flux passing through the magnetic sensor 41, 42 changes substantially proportionally to the amount of torsional displacement of the torsion bar 13 and changes the polarity in accordance with the direction of torsion of the torsion bar 13. The magnetic sensors 41, 42 detect the magnetic flux density passing in the direction perpendicular to the magnetosensitive surfaces 412, 413, 422, 423, that is, the strength of the magnetic field. The torque sensor 1 thus detects the steering torque between the input shaft 11 and the output shaft 12 by outputting a voltage corresponding to the detected magnetic field strength as an output signal.

In the torque sensor 1 according to the first embodiment, the magnetic sensor 41, 42 has: the magnetosensitive surface 412, 422 formed to face the radially outer end face of the annular portion 311 of the magnetic yoke 31; and the magnetosensitive surface 413, 423 formed to be directed radially outward. Since the magnetosensitive surface 412, 422 is provided to face the magnetic yoke 31, the magnetic sensor 41, 42 can be easily magnetically coupled to the magnetic circuit of the magnetic yoke 31. The magnetosensitive surface 413, 423 magnetically couples the magnetic yoke 32 and the magnetic sensor 41, 42 via the magnetic flux guiding member 43. Thus, the magnetic sensors 41 and 42 can reliably detect the magnetic flux density of the magnetic circuit of the magnetic yokes 31 and 32. Therefore, the body size can be made smaller in the radial direction in the first embodiment, compared with a torque sensor formed so that the wiring protrudes radially outward from the magnetic sensor since the magnetosensitive surface is formed along the axial direction.

Further, in the torque sensor 1, the magnetic sensors 41 and 42 and the magnetic flux guiding member 43 are housed in the substantially rectangular connector portion 45. Therefore, the water blocking structure for the magnetic sensors 41 and 42 can be made simple as compared with a case where, for example, the magnetic sensor and a magnetic collecting ring are integrally and annularly sealed in a torque sensor. Therefore, there is no path through which water can penetrate from the outside, such as interface between the members in the member, to prevent contact between the magnetic sensor 41, 42 and water. Thus, the contact between the magnetic sensor 41, 42 and water is surely prevented.

As described above, in the torque sensor 1, the magnetic flux density is reliably measured by the magnetic sensors 41 and 42 having the magnetosensitive surfaces 412 and 422, and the magnetic flux guiding member 43 capable of magnetically coupling the magnetosensitive surface 413, 423 and the magnetic yoke 32, while reducing the physical size in the radial direction. Waterproofness can be improved by reliably blocking contact between the magnetic sensor 41, 42 and water by the connector portion 45 having a simple configuration.

Further, the connector portion 45 houses the magnetic sensors 41 and 42 and the magnetic flux guiding member 43, and the magnetosensitive surfaces 412 and 422 of the magnetic sensors 41 and 42 face the radially outer end surface of the annular portion 311 of the magnetic yoke 31. Therefore, the magnetic sensors 41 and 42 and the magnetic flux guiding member 43 can be provided at the optimum position in detection of the magnetic flux density only by adjusting the positional relationship between the pair of magnetic yokes 31 and 32 and the connector portion 45, compared with a torque sensor provided with a magnetic collecting ring where a magnetic sensor is provided. That is, the detection sensitivity of the magnetic flux density of can be improved.

Further, since the magnetic sensors 41 and 42 and the magnetic flux guiding member 43 are housed in the connector portion 45 and integrally formed, the connector portion 45 can be easily separated from the pair of magnetic yokes 31 and 32 fixed to the output shaft 12. Thus, the magnetic sensors 41 and 42 can be easily attached and detached.

The magnetic sensors 41 and 42 are provided to be opposed to the radially outer end surface of the annular portion 311 of the magnetic yoke 31. Thereby, the leakage flux from the multipole magnet 20 is blocked by the magnetic yoke 31. Thereby, a fall in the detection sensitivity of the magnetic sensor 41,42 caused by the leakage flux from the multipole magnet 20 can be prevented.

The end surface 434 of the first radial portion 431 of the magnetic flux guiding member 43 is provided in the vicinity of the magnetosensitive surfaces 413 and 423. Thus, the magnetic flux guiding member 43 functions as a magnetic shield that prevents a magnetic flux of external magnetic noise from passing through the magnetosensitive surfaces 413 and 423. Therefore, it is possible to prevent a decrease in detection sensitivity of the torque sensor 1 due to the external magnetic noise.

Second Embodiment

Figure 5:
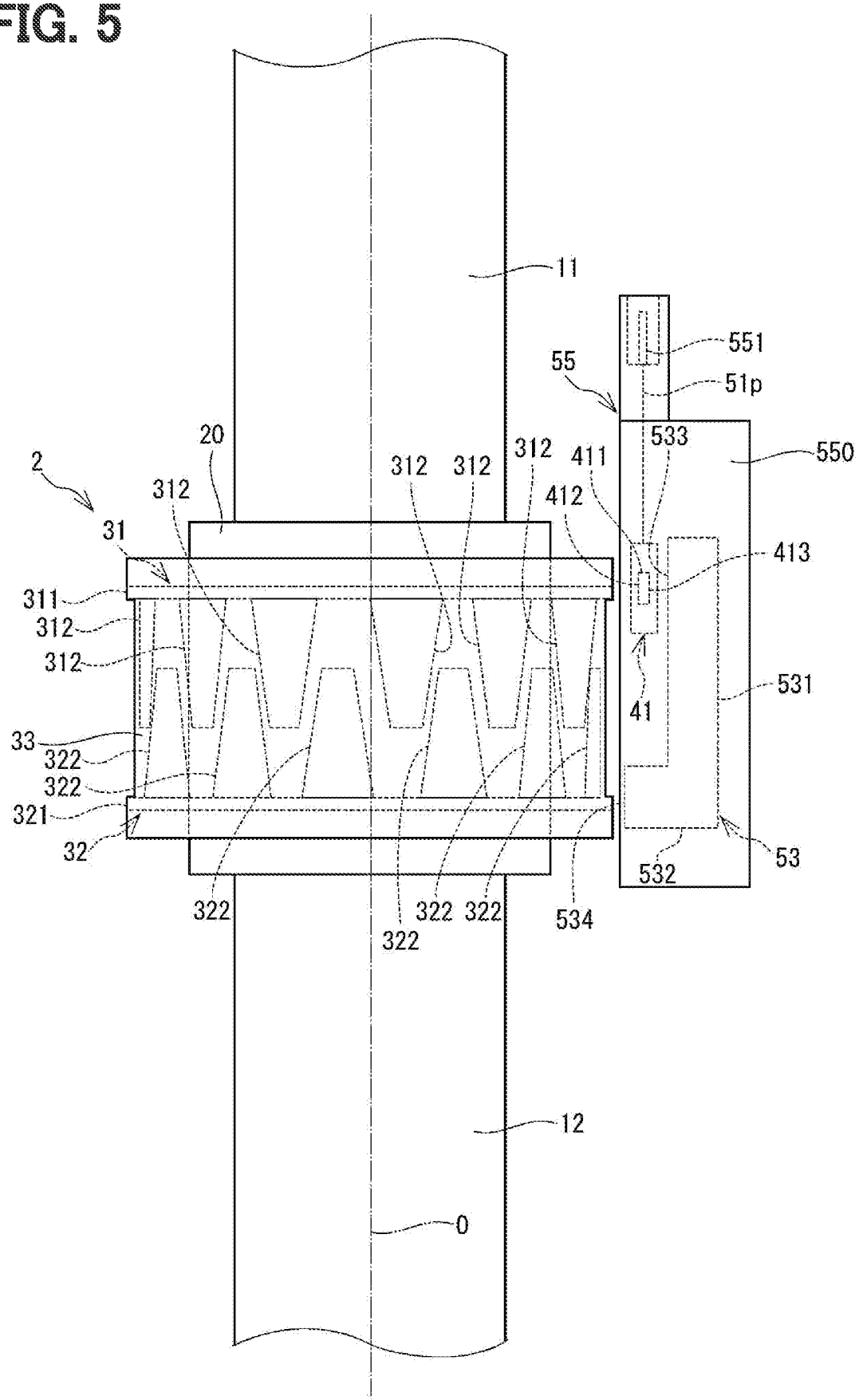
FIG. 5 is a side view of a torque sensor according to a second embodiment.

A torque sensor according to a second embodiment will be described based on FIG. 5. In the second embodiment, the configuration of the connector portion is different from that of the first embodiment.

The torque sensor 2 according to the second embodiment includes a torsion bar 13, a multipole magnet 20, a pair of magnetic yokes 31 and 32, two magnetic sensors 41 and 42, a magnetic flux guiding member 53, and a connector portion 55 as a "water blocking portion."

In the second embodiment, unlike the first embodiment, the two magnetic sensors 41 and 42 are not mounted on the circuit board. The magnetic sensor 41, 42 has a wiring electrically connected to the Hall element 411, 421 and formed to extend linearly along the rotation axis O (only the power supply line 51p is shown in FIG. 5, which is electrically connected to the magnetic sensor 41), and the wiring is electrically connected to the ECU 91 through a terminal 551 of the connector portion 55.

The magnetic flux guiding member 53 is made of a soft magnetic material, and is provided radially outward of the magnetic sensors 41 and 42 and radially outward of the magnetic yoke 32 when viewed from the rotation axis O. As shown in FIG. 5, the magnetic flux guiding member 53 is housed in the connector portion 45 together with the two magnetic sensors 41 and 42.

The magnetic flux guiding member 53 has an axial portion 531 and a radial portion 532. The axial portion 531 and the radial portion 532 are integrally formed. The magnetic flux guiding member 53 is magnetically coupled to the magnetic yoke 31, the magnetic sensors 41 and 42, and the magnetic yoke 32 to induce the magnetic flux of the magnetic circuit formed in the magnetic yokes 31 and 32.

The axial portion 531 is formed to extend along the output shaft 12 from the radially outer side of the magnetic sensor 41, 42 when viewed from the rotation axis O. The axial portion 531 has the end face 533 in the vicinity of the magnetic sensor 41, 42, and the end face 533 faces the magnetosensitive surfaces 413 and 423. The axial portion 531 can be magnetically coupled to the magnetosensitive surfaces 413 and 423 of the magnetic sensors 41 and 42.

The radial portion 532 is formed to extend inward of the magnetic yoke 32 in the radial direction from the end of the axial portion 531 adjacent to the output shaft 12. The radial portion 532 is formed such that the radially inner end surface 534 faces the radially outer end surface of the annular portion 321 of the magnetic yoke 32. The radial portion 532 can be magnetically coupled to the magnetic yoke 32.

The connector portion 55 is a substantially rectangular member. The connector portion 55 has a sealing portion 550 and a terminal 551.

The sealing portion 550 is a substantially rectangular portion formed of a resin. The sealing portion 550 houses the magnetic sensors 41 and 42 and the magnetic flux guiding member 53 inside.

The terminal 551 is formed to protrudes from the sealing portion 550. The terminal 551 is electrically connected to each of the electrical wirings of the magnetic sensors 41 and 42.

When assembling the torque sensor 2, the magnetic sensors 41 and 42, the magnetic flux guiding member 43, and the terminals 551 electrically connected to the electrical wirings of the magnetic sensors 41 and 42 are sealed with resin or the like. Thereby, the magnetic sensors 41 and 42 are restricted from contacting water.

The torque sensor 2 according to the second embodiment includes the magnetic sensors 41 and 42, the magnetic flux guiding member 53 capable of magnetically coupling the magnetosensitive surfaces 413 and 423 and the magnetic yoke 32, and the connector portion 55 housing the magnetic sensors 41 and 42 and the magnetic flux guiding member 53. In this way, the second embodiment achieves the advantages that are the same as those of the first embodiment.

Further, in the torque sensor 2, the electric wirings such as the power supply lines 51p of the magnetic sensors 41 and 42 are formed to extend linearly from the magnetic sensors 41 and 42 along the rotation axis O unlike the first embodiment. Further, unlike the first embodiment, the axial portion 531 of the magnetic flux guiding member 53 located in the vicinity of the magnetic sensors 41 and 42 is formed to extend in the direction of the output shaft 12 from the radially outer side of the magnetic sensors 41 and 42. Thereby, the physical size of the connector portion 55 in the radial direction can be further reduced as compared with the first embodiment.

Third Embodiment

A torque sensor according to a third embodiment will be described based on FIG. 6 and FIG. 7. The third embodiment differs from the first embodiment in that two magnetic collection rings are provided.

The torque sensor 3 according to the third embodiment includes a torsion bar 13, a multipole magnet 20, a pair of magnetic yokes 31 and 32, two magnetic sensors 41 and 42, two magnetic collection rings 46 and 47, a magnetic flux guiding member 43, and a connector portion 45.

The magnetic collection ring 46 is a substantially annular member formed of a soft magnetic material. The magnetic collection ring 46 has a main body 461 and two collecting parts 462 and 463. The main body 461 and the collecting parts 462 and 463 are integrally formed.

The main body 461 is an annular portion provided on the radially outer side of the magnetic yoke 31. A portion of the main body 461 is located between the annular portion 311 of the magnetic yoke 31 and the magnetic sensors 41 and 42. The main body 461 is magnetically coupled to the magnetic yoke 31.

The collecting part 462 is a substantially flat portion provided on the main body 461 located between the annular portion 311 and the magnetic sensor 41. The collecting part 462 is formed to face the magnetosensitive surface 412 in the vicinity of the magnetic sensor 41. The collecting part 462 guides the magnetic flux formed in the main body 461 to the magnetic sensor 41.

The collecting part 463 is a substantially flat portion provided on the main body 461 located between the annular portion 311 and the magnetic sensor 42. The collecting part 463 is formed to face the magnetosensitive surface 422 in the vicinity of the magnetic sensor 42. The collecting part 463 guides the magnetic flux formed in the main body 461 to the magnetic sensor 42.

The magnetic collection ring 47 is an annular member formed of a soft magnetic material. The magnetic collection ring 47 has a main body 471 and a collecting part 472. The main body 471 and the collecting part 472 are integrally formed.

The main body 471 is an annular portion provided on the radially outer side of the magnetic yoke 32. A part of the main body 471 is located between the annular portion 321 of the magnetic yoke 32 and the magnetic flux guiding member 43. The main body 471 is magnetically coupled to the magnetic yoke 32.

The collecting part 472 is a substantially flat portion provided on the main body 471 located between the annular portion 321 and the magnetic flux guiding member 43. The collecting part 472 is formed to face the end surface 435 in the vicinity of the magnetic flux guiding member 43. The collecting part 472 guides the magnetic flux formed in the main body 471 to the magnetic flux guiding member 43.

Figure 6:
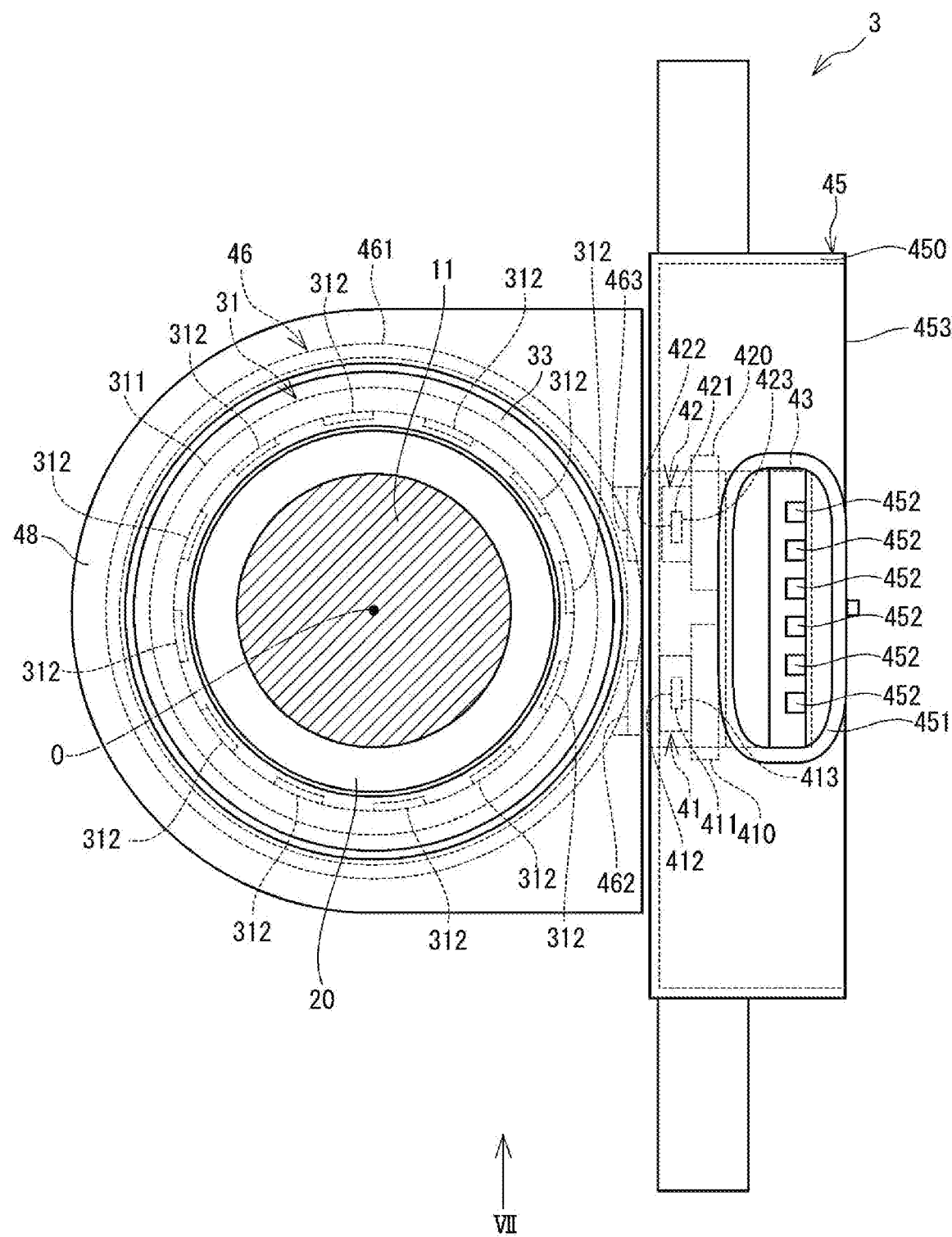
FIG. 6 is a top view of a torque sensor according to a third embodiment.
Figure 7:
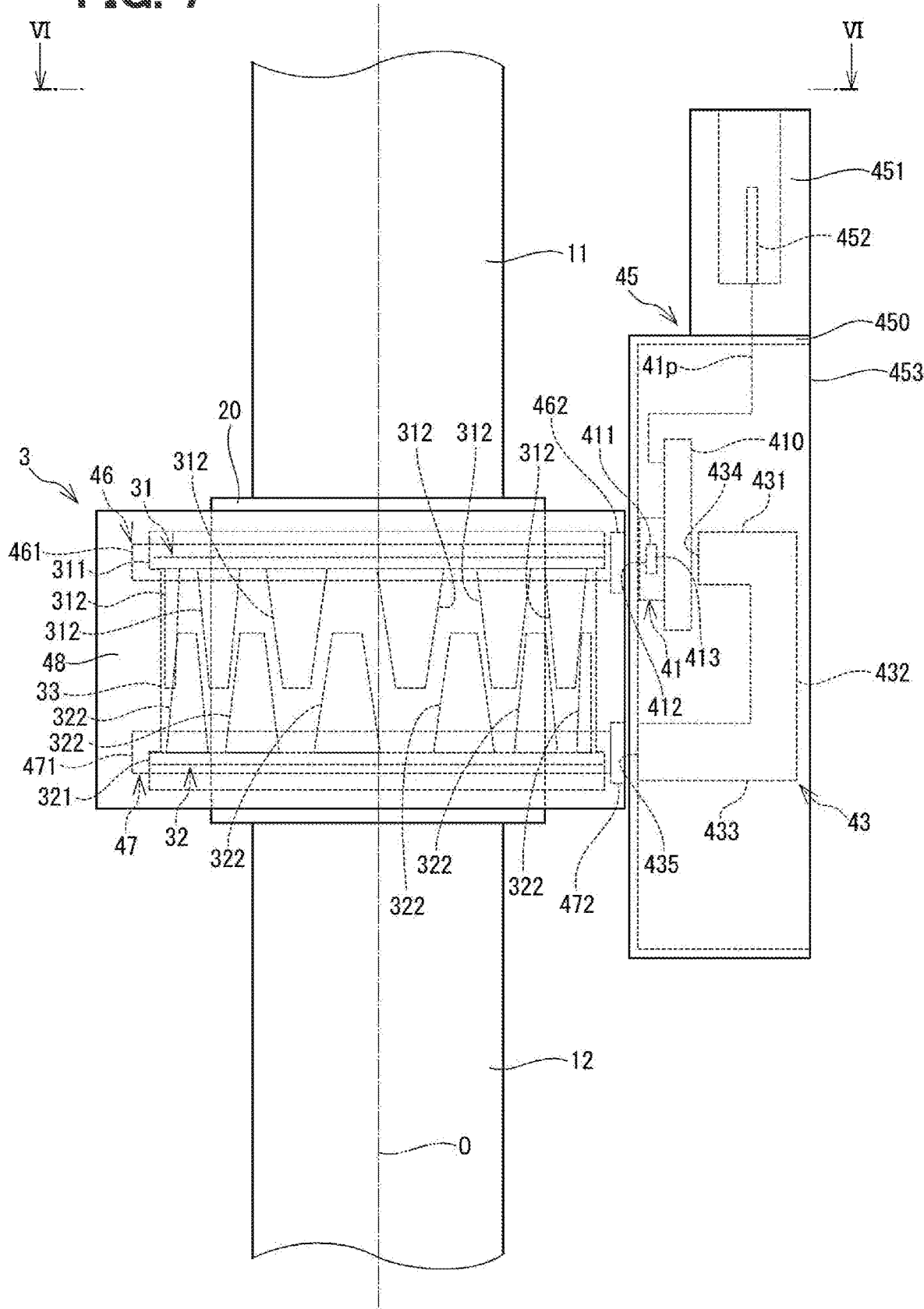
FIG. 7 is a side view of the torque sensor according to the third embodiment.

In the third embodiment, as shown in FIGS. 6 and 7, the two magnetic collection rings 46 and 47 are resin-sealed by the resin portion 48 and formed integrally. The resin portion 48 is provided to be separated from the connector portion 45.

The torque sensor 3 according to the third embodiment includes the magnetic sensors 41 and 42, the magnetic flux guiding member 43, and the connector portion 45. The third embodiment achieves the advantages that are the same as those of the first embodiment.

The magnetic collection ring 46 is formed to face the magnetosensitive surfaces 412 and 422 in the vicinity of the magnetic sensors 41 and 42. The magnetic collection ring 47 is located in the vicinity of the end surface 435 of the second radial portion 433 of the magnetic flux guiding member 43. Thus, the magnetic collection rings 46 and 47 function as a magnetic shield that prevents magnetic flux of external magnetic noise from passing through the magnetosensitive surfaces 412 and 422 and the end surface 435. Therefore, the detection sensitivity of the torque sensor 3 can be prevented from falling.

Further, in the torque sensor 3, when the torsion bar 13 is twisted, a magnetic circuit is formed to pass through the magnetic yoke 31, the magnet collection ring 46, the magnetic sensors 41 and 42, the magnetic flux guiding member 43, the magnetic collection ring 47 and the magnetic yoke 32. Thereby, the magnetic flux density passing through the magnetic sensors 41 and 42 can be increased as compared with a case where there is no magnetic collection ring. Therefore, the third embodiment can improve the detection sensitivity of the magnetic flux density by the magnetic sensors 41 and 42.

Fourth Embodiment

A torque sensor according to a fourth embodiment will be described based on FIG. 8. The fourth embodiment is different from the first embodiment in that one magnetic collection ring is provided.

The torque sensor 4 according to the fourth embodiment includes a torsion bar 13, a multipole magnet 20, a pair of magnetic yokes 31 and 32, two magnetic sensors 41 and 42, a magnetic collection ring 46, a magnetic flux guiding member 43, and a connector portion 45.

The torque sensor 4 according to the fourth embodiment includes the magnetic sensors 41 and 42, the magnetic flux guiding member 43, and the connector portion 45. The fourth embodiment thus achieves the same advantage as that of the first embodiment.

Figure 8:
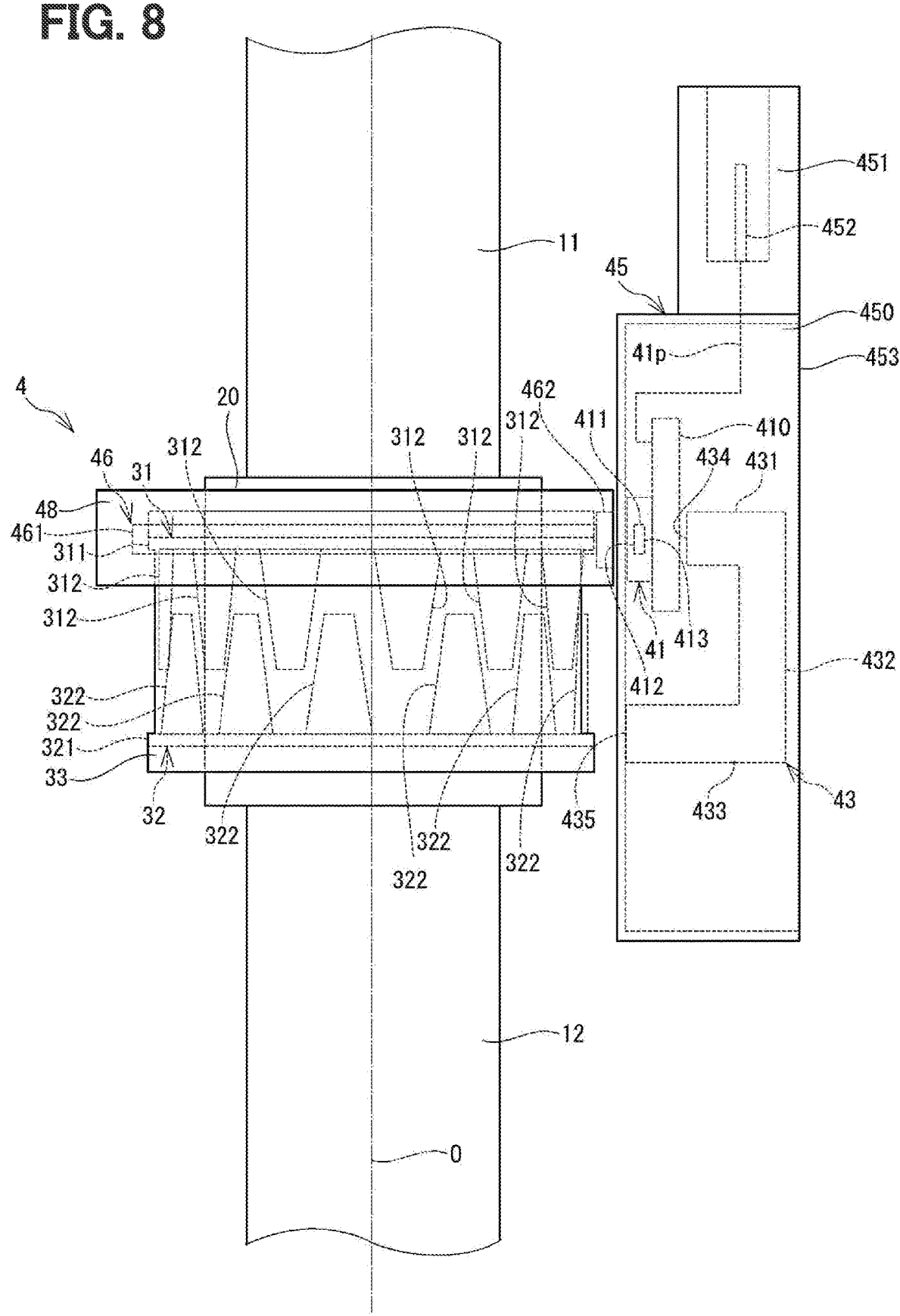
FIG. 8 is a side view of a torque sensor according to a fourth embodiment.

Further, as shown in FIG. 8, in the torque sensor 3, the magnetic collection ring 46 is provided in the radially outer side of the magnetic yoke 31. Thus, in the fourth embodiment, as in the third embodiment, the detection sensitivity of the magnetic sensors 41 and 42 can be prevented from being lowered. In other words, the detection sensitivity of the magnetic sensors 41 and 42 can be improved.

Other Embodiments

In the above embodiment, the torque sensor is applied to the electric power steering apparatus. However, the device to which the torque sensor of the present disclosure is applied is not limited thereto. The present disclosure may be applied to other device in which a torsion bar converts torque to torsional displacement.

In the above embodiment, one magnetic flux guiding member is provided for two magnetic sensors. However, a magnetic flux guiding member may be provided for each of the magnetic sensors. That is, there may be plural magnetic flux guiding members. Also, the number of magnetic sensors may be one.

Figure 9:
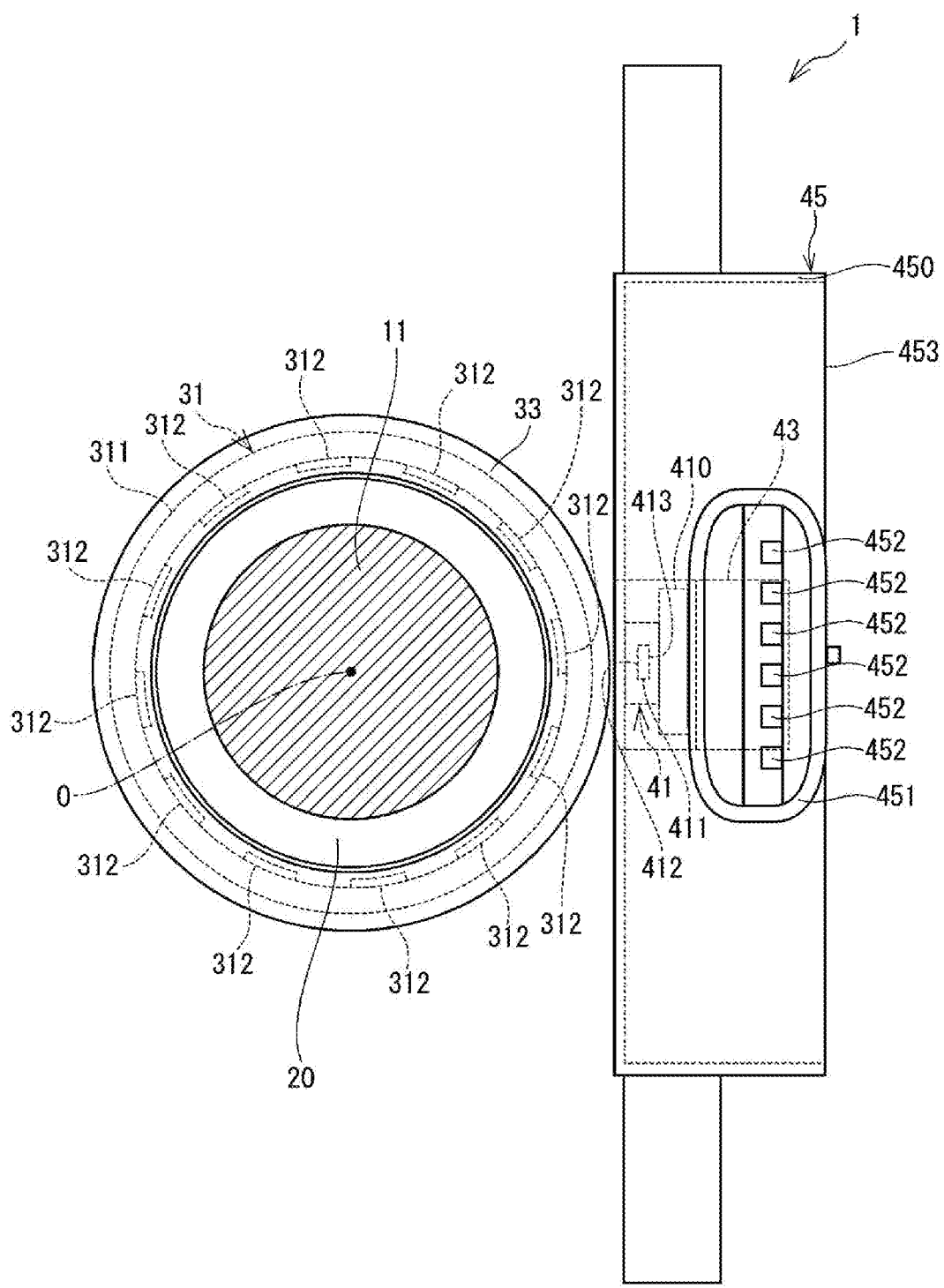
FIG. 9 is a top view of a torque sensor according to another embodiment.

Specifically, as shown in FIG. 9, as a modification of the first embodiment, one magnetic flux guiding member 43 may be provided for one magnetic sensor 41 in a torque sensor 1.

In the above embodiment, the magnetosensitive surface is oriented in a direction substantially parallel to the direction perpendicular to the rotation axis O. However, the orientation of the magnetosensitive surface is not limited to this. The magnetosensitive surface may be oriented in a direction different from the rotation axial direction.

Figure 10:
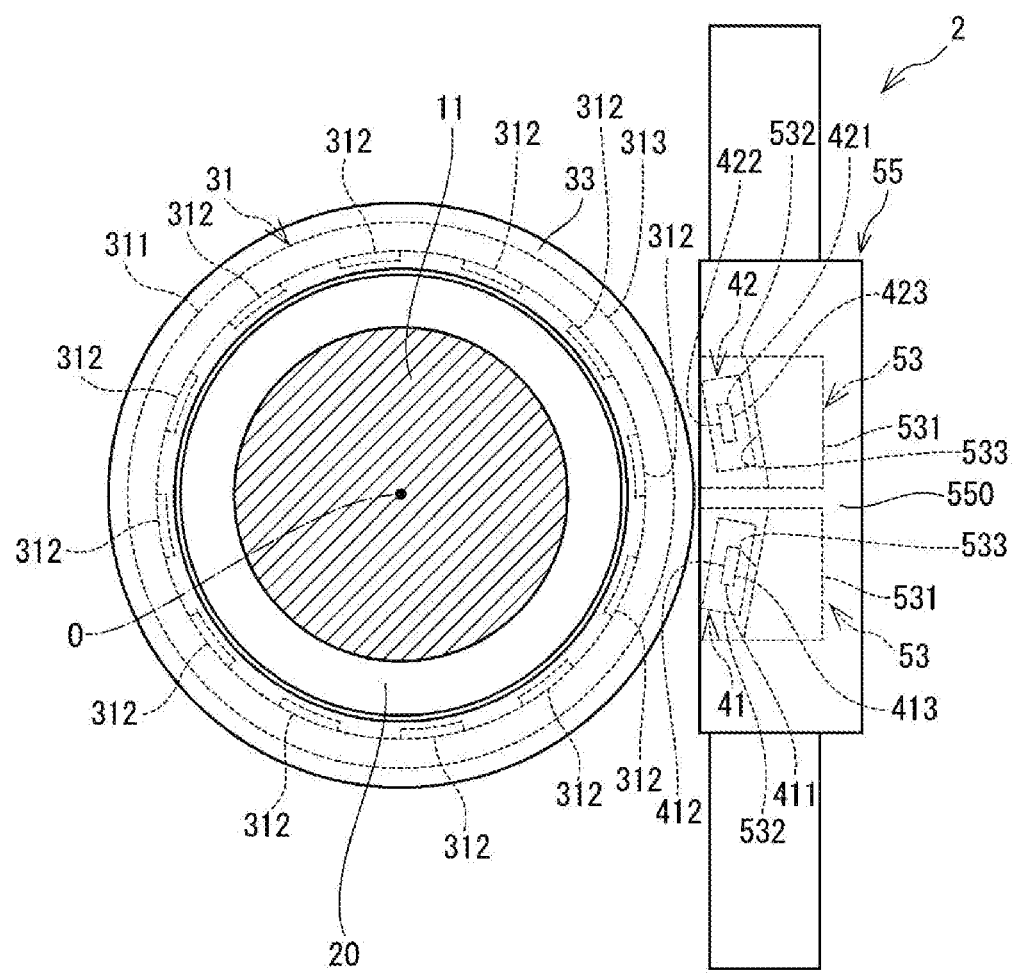
FIG. 10 is a top view of a torque sensor according to another embodiment.

FIG. 10 shows a torque sensor 2 as a modification of the second embodiment. Note that, in FIG. 10, in order to avoid complication of the drawing, the terminals 551 and portions for housing the terminals 551 are omitted.

In the torque sensor 2 shown in FIG. 10, the magnetosensitive surfaces 412 and 422 of the two magnetic sensors 41 and 42 are formed inward of the magnetic yoke 31 in the radial direction. Specifically, the magnetosensitive surfaces 412 and 422 are formed along the radially outer end surface 313 of the annular portion 321 of the magnetic yoke 31 formed in a curved shape. At this time, the magnetosensitive surface 413 of the magnetic sensor 41 and the magnetosensitive surface 423 of the magnetic sensor 42 are formed to be oriented outward of the magnetic yoke 31 in the radial direction.

The torque sensor 2 shown in FIG. 10 includes two magnetic flux guiding members 53 corresponding to the magnetic sensors 41 and 42, respectively. The end face 533 of the axial portion 531 of the magnetic flux guiding member 53 facing the magnetosensitive surfaces 413 and 423 is formed to be substantially parallel to the magnetosensitive surfaces 413 and 423, as shown in FIG. 10.

As described above, the detection sensitivity of the magnetic flux density of the magnetic sensors 41 and 42 can be improved by forming the magnetosensitive surfaces 412 and 422 of the two magnetic sensors 41 and 42 along the radially outer end face of the annular portion 321 of the magnetic yoke 31. Further, the detection sensitivity of the magnetic flux density of the magnetic sensors 41 and 42 can be further improved by forming the end face 533 of the magnetic flux guiding member 53 to be substantially parallel to the magnetosensitive surfaces 413 and 423.

In the above embodiment, the power supply line, the ground line, and the signal line are formed to extend in the rotation axial direction. However, the power supply line, the ground line, and the signal line may not be formed to extend in the rotation axial direction. For example, the power supply line, the ground line, and the signal line may be formed to extend in a tangential direction of an imaginary circle having a center at the rotation axis.

In the above embodiment, the magnetic collection ring is a substantially annular member. However, the shape of the magnetic collection ring is not limited to this. The shape of the magnetic collection ring may be an arc shape.

The present disclosure should not be limited to the embodiments described above, and various other embodiments may be implemented without departing from the scope of the present disclosure.

The present disclosure has been described in accordance with embodiments. However, the present disclosure is not limited to the embodiments and structures. This disclosure also encompasses various modifications and variations within the scope of equivalents. Furthermore, various combination and formation, and other combination and formation including one, more than one or less than one element may be made in the present disclosure.

What is claimed is:

1. A torque sensor comprising:
    a torsion bar coaxially connecting a first shaft and a second shaft to convert a torque applied between the first shaft and the second shaft into a torsional displacement;
    a multipole magnet fixed to the first shaft or one end of the torsion bar and having N poles and S poles alternately provided in a circumferential direction to generate magnetic flux in a radial direction;
    a pair of magnetic yokes fixed to the second shaft or the other end of the torsion bar to form a magnetic circuit in a magnetic field formed by the multipole magnet;
    a magnetic sensor capable of detecting a density of the magnetic flux formed by the pair of the magnetic yokes, the magnetic sensor being located at a position on an outer side of the pair of magnetic yokes in the radial direction and distanced from the magnetic yoke, the magnetic sensor having an inner magnetosensitive surface facing inward in the radial direction and an outer magnetosensitive surface facing outward in the radial direction when viewed along a central axis of the torsion bar;
    a magnetic flux guiding member made of a soft magnetic material and located on an outer side of the outer magnetosensitive surface in the radial direction, the magnetic flux guiding member being capable of magnetically coupling the magnetic yoke and the outer magnetosensitive surface of the magnetic sensor; and
    a water blocking portion capable of housing the magnetic sensor and the magnetic flux guiding member to restrict the magnetic sensor from coming into contact with water.

2. The torque sensor according to claim 1, wherein
the inner magnetosensitive surface and the outer magnetosensitive surface are oriented in the radial direction of the magnetic yoke formed in an annular shape.

3. The torque sensor according to claim 1, wherein
the magnetic sensor includes
    a power supply line configured to receive power supplied from outside,
    a ground line electrically connected to a ground, and
    a signal line configured to output an output signal to outside, in response to a detected density of the magnetic flux of the magnetic circuit, and
the power supply line, the ground line, and the signal line extend in a direction along a central axis of the torsion bar.

4. The torque sensor according to claim 1 further comprising:
    a magnetic collection ring magnetically coupled to at least one of the pair of magnetic yokes to induce a magnetic flux forming the magnetic circuit, wherein
    the magnetic sensor detects a density of magnetic flux induced by the magnetic collection ring.

5. The torque sensor according to claim 4, wherein the magnetic collection ring serves as a magnetic shield against external magnetic noise.

6. The torque sensor according to claim 4, wherein
the magnetic collection ring is provided between the pair of the magnetic yokes and the magnetic flux guiding member or/and between the pair of the magnetic yokes and the inner magnetosensitive surface.

7. The torque sensor according to claim 1, wherein the magnetic flux guiding member serves as a magnetic shield against external magnetic noise.

* * * * *